US012610492B2

(12) United States Patent
An et al.

(10) Patent No.: US 12,610,492 B2
(45) Date of Patent: Apr. 21, 2026

(54) EMC FILTER DEVICE HAVING A LAMINATED CONDUCTOR STRUCTURE; AND POWER ELECTRONICS MODULE

(71) Applicant: Schaeffler Technologies AG & Co. KG, Herzogenaurach (DE)

(72) Inventors: Bao Ngoc An, Karlsruhe (DE); Eduard Enderle, Gengenbach (DE); Ingo Bamberg, Willstätt (DE); Andreas Humbert, Ottersweier (DE); Mihai Cretu, Kappelrodeck (DE); Jürgen Tipper, Gernsbach (DE)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 252 days.

(21) Appl. No.: 18/287,298

(22) PCT Filed: Apr. 29, 2022

(86) PCT No.: PCT/DE2022/100319
§ 371 (c)(1),
(2) Date: Oct. 18, 2023

(87) PCT Pub. No.: WO2022/228616
PCT Pub. Date: Nov. 3, 2022

(65) Prior Publication Data
US 2024/0215194 A1 Jun. 27, 2024

(30) Foreign Application Priority Data

Apr. 29, 2021 (DE) ..................... 10 2021 110 983.3

(51) Int. Cl.
*H05K 7/14* (2006.01)
*H02M 7/00* (2006.01)
*H05K 9/00* (2006.01)

(52) U.S. Cl.
CPC ........ *H05K 7/14329* (2022.08); *H02M 7/003* (2013.01); *H05K 9/0066* (2013.01)

(58) Field of Classification Search
None
See application file for complete search history.

(56) References Cited

U.S. PATENT DOCUMENTS

| | | | | |
|---|---|---|---|---|
| 6,366,467 | B1 * | 4/2002 | Patel .................... | H05K 7/1092 |
| | | | | 257/691 |
| 6,778,405 | B2 * | 8/2004 | Boylan .................. | H05K 1/141 |
| | | | | 361/767 |
| 10,993,325 | B2 * | 4/2021 | Trelford ................. | H05K 1/144 |
| 2003/0058628 | A1 * | 3/2003 | Boylan .................. | H05K 1/141 |
| | | | | 361/767 |

(Continued)

FOREIGN PATENT DOCUMENTS

| | | |
|---|---|---|
| CN | 104467509 A | 3/2015 |
| DE | 102010030917 A1 | 4/2011 |

(Continued)

*Primary Examiner* — Krystal Robinson
(74) *Attorney, Agent, or Firm* — Volpe Koenig

(57) ABSTRACT

An EMC filter device for power electronics of an electric machine includes an electric conductor structure, a capacitor coupled to the conductor structure, and an inductor that cooperates with the conductor structure. The conductor structure has at least two separate conducting layers that are insulated from one another.

15 Claims, 5 Drawing Sheets

(56)     References Cited

U.S. PATENT DOCUMENTS

| | | | | |
|---|---|---|---|---|
| 2011/0043303 A1* | 2/2011 | Herron | ................. | H05K 1/0233 |
| | | | | 333/185 |
| 2011/0188218 A1* | 8/2011 | Hsing | ...................... | H01R 9/00 |
| | | | | 361/772 |
| 2013/0119834 A1* | 5/2013 | Nakagami | .............. | H02K 11/05 |
| | | | | 310/68 D |
| 2013/0154766 A1* | 6/2013 | Beck | ................... | H03H 1/0007 |
| | | | | 333/182 |

FOREIGN PATENT DOCUMENTS

| | | | |
|---|---|---|---|
| DE | 102011017314 | A1 | 10/2012 |
| DE | 202016105142 | U1 | 12/2016 |
| DE | 102015219643 | A1 | 4/2017 |
| DE | 102020206199 | A1 | 11/2021 |
| DE | 102021110986 | A1 | 11/2022 |
| DE | 102021110988 | A1 | 11/2022 |
| DE | 102021110991 | A1 | 11/2022 |

* cited by examiner

EMC FILTER DEVICE HAVING A LAMINATED CONDUCTOR STRUCTURE; AND POWER ELECTRONICS MODULE

CROSS-REFERENCE TO RELATED APPLICATIONS

This application is the U.S. National Phase of PCT Appln. No. PCT/DE2022/100319 filed Apr. 29, 2022, which claims priority to DE 102021110983.3 filed Apr. 29, 2021, the entire disclosures of which are incorporated by reference herein.

TECHNICAL FIELD

The present disclosure relates to an EMC filter device for power electronics of an electric machine, preferably an electric machine used as a drive unit in a motor vehicle.

SUMMARY

The present disclosure provides, according to an exemplary embodiment, a filter device that functions as reliably as possible in the manner of a mains filter for use in power electronics, which on the one hand has a structure that is as compact, in particular as shallow, as possible, and on the other hand is equipped with as few interfaces/contacts as possible.

An EMC filter device for the power electronics of an electric machine has an electrical conductor structure, at least one capacitor coupled to the conductor structure and at least one inductor interacting with the conductor structure, wherein the conductor structure has at least two separate conducting layers insulated from one another and is thus configured, for example, as a laminated busbar or high-current circuit board.

The abbreviation "EMC" used herein stands for "Electromagnetic Compatibility". Accordingly, an EMC filter device is a filter device that ensures or improves the electromagnetic compatibility of a device, for example, a power electronics module, to which the filter device is coupled.

Due to the compact design thereof, this EMC filter device according to the present disclosure can be integrated more easily into existing installation spaces, for example, in a housing of an inverter unit, or the inverter unit can be more compactly configured overall. In addition, cooling can be implemented more efficiently by configuring the conductor structure as a laminated busbar. Furthermore, the number of necessary interfaces/contacts can be reduced to a minimum.

Accordingly, it is also advantageous for an insulating film/foil to be arranged between the individual conducting layers of the conductor structure. As a result, the conductor structure is also constructed as compactly as possible.

In this regard, it is also expedient for the conductor structure in its entirety to be surrounded/encased outwardly/on the outside by an insulating film/foil.

It is also advantageous for the at least one inductor to have a core (for example, designed as a toroidal core) and for the conductor structure to be inserted/project through this core. This also results in an arrangement that is as compact as possible.

The structure is further simplified if the at least one capacitor is connected to a terminal that can be or is further connected to a power supply, for example, a battery, which terminal can be in turn formed directly on the conductor structure.

Furthermore, the present disclosure relates to a power electronics module for an electric machine, having a capacitor arrangement and an EMC filter device according to the present disclosure, which is electrically connected to the capacitor arrangement, according to at least one of the previously described embodiments.

It has also proved advantageous for the conductor structure to be mounted to a region of the capacitor arrangement which is fixed to a housing. As a result, a housing region/housing of the power electronics module can be used directly to accommodate the EMC filter device, as a result of which further installation space is saved.

For the EMC filter device to function as efficiently as possible, it is also expedient for a thermally conducting layer/thermally conductive material, for example, in the form of a "gap pad"/mat, to be provided between the conductor structure and a region fixed to the housing. This results in maximally efficient cooling of the EMC filter device when in operation.

As an alternative to the provision of a thermally conducting layer, it is advantageous in a further embodiment to have the conductor structure (at least partially) lie flat directly on the region fixed to the housing. In this way the structure is further simplified.

Furthermore, it is also advantageous in this respect for the inductors/cores of the EMC filter device to be glued to the region fixed to the housing.

Furthermore, it is advantageous for a current input of the power electronics module to be formed directly by the conductor structure and a current output of the power electronics module to be formed by the capacitor arrangement.

In other words, an EMC filter (EMC filter device) based on a laminated "busbar" (/a laminated electrical busbar/busbar/conductor structure) is thus implemented according to the present disclosure. The laminated busbar includes at least two electrically conductive plies/layers (conducting layers) that are insulated from one another. The laminated busbar is routed through cores (inductors). Capacitors are also provided on the laminated busbar: terminals that are further connected to a power supply are also provided. The terminals can be further connected to a power source such as a high voltage battery.

BRIEF DESCRIPTION OF THE DRAWINGS

The present disclosure will now be explained in more detail below with reference to figures.

In these.

The figures are merely schematic in nature and serve solely for understanding the present disclosure. The same elements are provided with the same reference symbols.

DETAILED DESCRIPTION

Figure 1:
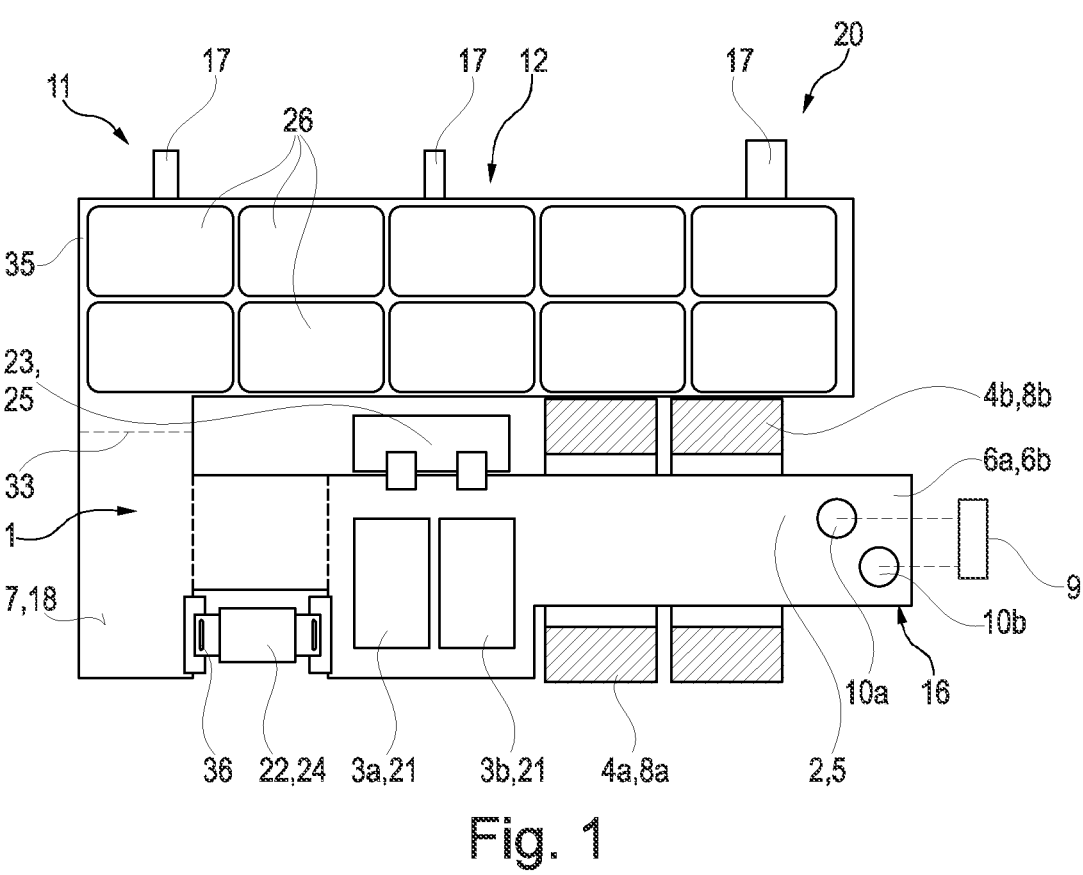
FIG. 1 shows a plan view of an exemplary embodiment of an EMC filter device according to the present disclosure as part of a power electronics module configured as an inverter unit.

FIG. 1 clearly shows an EMC filter device 1 according to the present disclosure. In this embodiment, the EMC filter device 1 is implemented as an independent module, but in further embodiments according to the present disclosure it is also directly embodied as a component of a power electronics module 20/inverter unit 11. The inverter unit 11 then in turn forms a component of the power electronics module 20 indicated generally in FIG. 1/power electronics for an electric machine. The EMC filter device 1 is thus used in the power electronics of an electric machine, preferably configured as a drive unit, of a motor vehicle.

Figure 2:
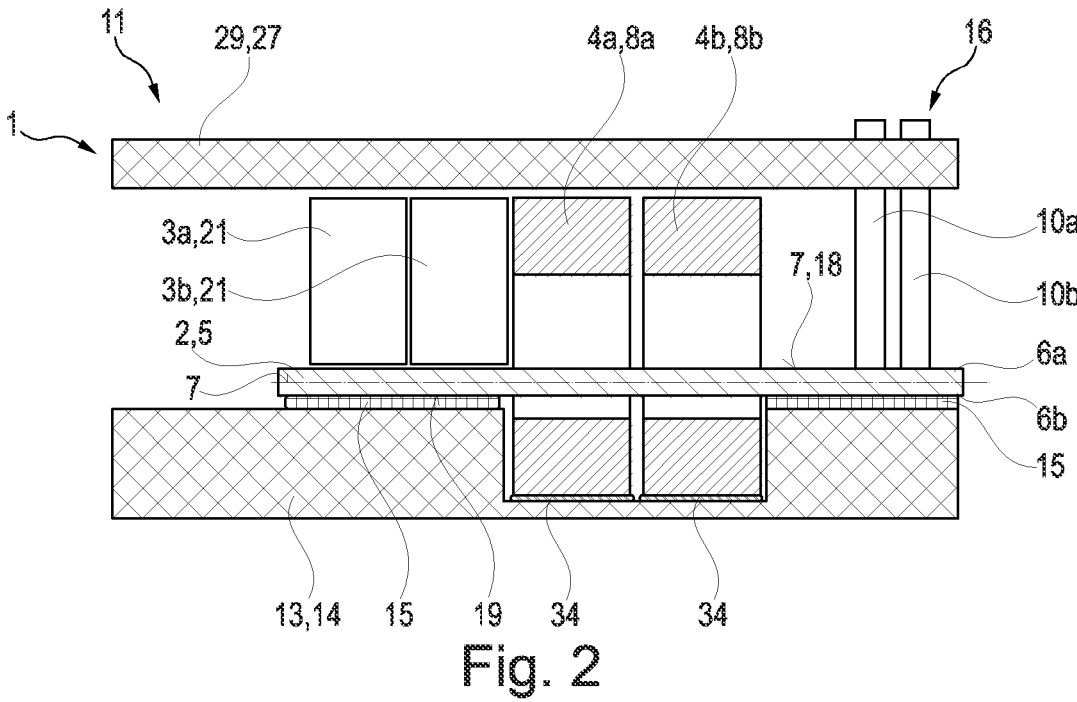
FIG. 2 shows a cross-sectional representation of the EMC filter device according to FIG. 1, such that a heat-conducting material arranged between a conductor structure and a region fixed to the housing can be clearly seen.
Figure 3:
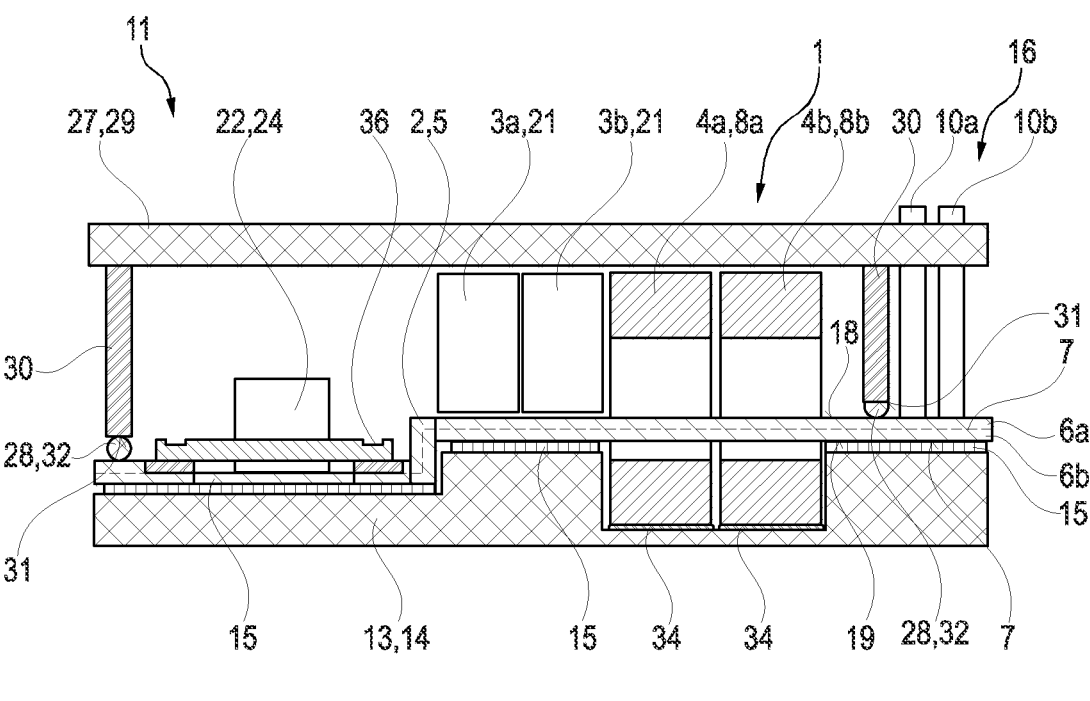
FIG. 3 shows a further cross-sectional view of the EMC filter device, wherein further components are visible compared to FIG. 2, including a current sensor and two side walls used for shielding.

The EMC filter device 1, as can also be seen in more detail in FIGS. 2 and 3, has a laminated conductor structure 2 which is implemented here as a laminated busbar 5. In further embodiments, the conductor structure 2 is also implemented as a printed circuit board, namely as a high-current circuit board. The conductor structure 2, which is alternatively also referred to as a(n electrical) busbar, has a plurality of conducting layers 6a, 6b, which are indicated in FIG. 2 and in FIG. 3 and are insulated from one another. The conducting layers 6a, 6b lie flat/coplanar on one another and form as a whole the conductor structure 2/busbar 5. Between the conducting layers 6a, 6b, as also indicated in FIGS. 2 and 3, an insulating film/foil 7 is interposed which is used directly to insulate the two conducting layers 6a, 6b relative to one another. The conductor structure 2, i.e., the entirety of conducting layers 6a, 6b, is also sealed from the outside thereof by such an insulating film/foil 7. In further embodiments, the conductor structure 2 also consists of more than two, for example three or four, conducting layers 6a, 6b.

The conductor structure 2 has a substantially plate-shaped structure. According to the configuration as an EMC filter device 1, the conductor structure 2 has two inductors 4a, 4b. A first inductor 4a has a first core 8a, and a second inductor 4b has a second core 8b. Each core 8a, 8b is embodied as a toroidal core/is ring-shaped. One portion of the conductor structure 2 extends centrally through these cores 8a, 8b arranged next to one another.

Two terminals 10a, 10b are implemented on the conductor structure 2 on the same side of the two inductors 4a, 4b and form a current input during operation. The two terminals 10a, 10b are connected to a power supply 9, preferably a high-voltage battery, during operation, as also indicated. The two terminals 10a, 10b form not only a current input of the EMC filter device 1, but also a current input 16 of the inverter unit 11 and the power electronics module 20.

Furthermore, two capacitors 3a, 3b are placed on/applied to the conductor structure 2. The two capacitors 3a, 3b thus form two first electronic components 21 which are accommodated/mounted on the conductor structure 2.

A further, second electronic component 22, which is accommodated/mounted on the conductor structure 2, takes the form of a current sensor 24 and is therefore used to detect an electric current (FIGS. 1 and 3). The current sensor 24 is attached to the conductor structure 2 via a weld point 36.

Furthermore, a third electronic component 23 in the form of a discharge resistor 25 is accommodated/mounted on the conductor structure 2 (FIG. 1).

FIG. 1 also shows that the conductor structure 2 is connected to a capacitor arrangement 12 of the inverter unit 11. A corresponding connection takes place, for example, in the region of a dividing line 33. In a further exemplary embodiment, however, the conductor structure 2 is also formed in one piece with a bar 35 of the capacitor arrangement 12, such that a plurality of capacitors 26 of the capacitor arrangement 12 are also arranged on the conductor structure 2. The EMC filter device 1 is then a direct component of an inverter unit 11 having the capacitor arrangement 12. The capacitors 26 are implemented as discrete capacitors 26 and are arranged in two parallel rows, for example.

The inverter unit 11 has a housing 13, which is also referred to as the inverter housing. This housing 13 encloses both the capacitor arrangement 12 and the EMC filter device 1 with the conductor structure 2. However, it should again be pointed out that in further embodiments, the EMC filter device 1 has its own housing, which is then mounted fixedly to the housing 13 and can therefore be referred to as a region 14, fixed to the housing, of the housing 13.

In this respect, it can be seen in FIG. 2 that the conductor structure 2 with its electronic components 21, 22, 23 and the inductors 4a, 4b is placed on the region 14, fixed to the housing, of the housing 13. The region 14 fixed to the housing is implemented here directly as a plate-shaped region of the housing 13. In further embodiments, the region 14 fixed to the housing is also configured in a different way as a heat sink, which is further connected to the housing 13.

It can also be seen from FIGS. 2 and 3 that a cover 29 is provided which, together with the region 14 fixed to the housing, accommodates the EMC filter device 1. When viewed in the plane of the drawing, the conductor structure 2 rests with its underside 19 (here indirectly) on the region 14 fixed to the housing. The electronic components 21, 22, 23 are attached to the upper side 18 thereof.

Furthermore, the two cores 8a, 8b are connected to the region 14 fixed to the housing via an adhesive connection 34. It can also be seen here that the two terminals 10a, 10b take the form of "pins" and project at least through the cover 29.

It should also be pointed out that in a further exemplary embodiment, a covering 27 which forms a shield is also formed by the cover 29. The covering 27 is formed by the cover 29 and a side wall 30 fastened to the cover 29. The cover 29 and side wall 30 thus form a shielding hood which is placed on the conductor structure 2 and is supported on the latter via the side walls 30.

In this regard, it can also be seen in FIG. 3 that an EMC seal 28 is interposed between an end face 31 of the side walls 30 and the conductor structure 2/the upper side 18 of the conductor structure 2. This EMC seal 28 has a sealing strip 32 or is implemented as such a sealing strip 32. The EMC seal 28 extends over the entire circumference of the side wall 30 and thus seals off an interior of the covering 27 from the environment. This shielding prevents interference signals from being coupled in.

The side walls 30 are formed separately from the cover 29 and are attached/mounted thereto. For example, the side wall 30 is welded to the cover 29 or attached in a non-positive manner, for example, via fastening means. In further embodiments, however, the side walls 30 are also configured as a component in one piece with the cover 29.

It can also be seen in FIGS. 2 and 3 that a thermally conducting layer 15, which is implemented as a "gap pad" in one exemplary embodiment, is inserted between the conductor structure 2 and the region 14 fixed to the housing. The layer 15 thus configured as a mat thus serves to dissipate waste heat from the conductor structure 2 in the direction of the region 14 fixed to the housing. The layer 15 is resiliently deformable and inserted in a compressed manner between the conductor structure 2 and the region 14 fixed to the housing. The layer 15 consists of a given thermally conductive material, such as a thermally conductive filled composite material. In further embodiments, the layer 15 is alternatively implemented as a gel layer or as a casting compound.

While the terminals 10*a*, 10*b*, as already mentioned, form the entire current input 16 of the inverter unit 11/power electronics module 20, an output of the capacitor arrangement 12 typically forms a current output 17 of the inverter unit 11/power electronics module 20, as indicated schematically in FIG. 1.

In other words, according to the present disclosure an EMC filter 1 is constructed on the basis of a laminated electrical busbar (busbar 5).

The laminated electrical busbar 5 consists of at least two electrically conducting layers (conducting layers 6*a*, 6*b*, made of copper for example), which are (electrically) insulated from one another by an insulating film/foil 7. The outer surfaces are in each case insulated by an insulating film/foil 7. Thus, the laminated electrical busbar 5 is made of two or more coplanar conductive plates (e.g., copper plates: also referred to as conducting layers 6*a*, 6*b*) laminated with insulating films/foils 7 in between and on the outside thereof.

The laminated electrical busbar 5 is inserted through cores 8*a*, 8*b* (inductors). The passive components (e.g., capacitors) can be soldered directly onto the laminated electrical busbar 5. Current sensor 24 (DC side) and discharge resistor 25 can be connected directly to the laminated electrical busbar 5 (e.g., by means of laser welding). In one variant embodiment, a DC link capacitor can be connected as a parallel connection of discrete capacitors (capacitors 3*a*, 3*b*) via the laminated electrical busbar 5.

Capacitors (capacitors 3*a*, 3*b*) are fitted on the laminated electrical busbar 5 and connected to the DC(+) and DC(−) contacts (terminals 10*a*, 10*b*). The laminated electrical busbar 5 is connected to the HV battery via the DC(+) and DC(−) terminals (terminals 10*a*, 10*b*).

In one alternative embodiment, the electrical busbar 5 can be mounted tightly to the inverter housing 13 or to a cooling surface and thermally connected to the inverter housing 13 via heat-conducting materials (e.g., gap pad). The cores 8*a*, 8*b* are placed in the inverter housing 13 and fixed with an adhesive (for example, epoxy adhesive) or with an encapsulant and thermally connected to the inverter housing 13.

An EMC shielding wall (side wall 30) is integrated into the inverter covering (covering 27) and provided with an EMC seal 28. Once the cover 29 has been closed, the EMC filter 1 and the DC input connector are protected from electromagnetic radiation in-coupling.

Various conductor structures 200 to 205 which can be used as alternatives to the above-described conductor structure 2 are described below.

Figure 4:
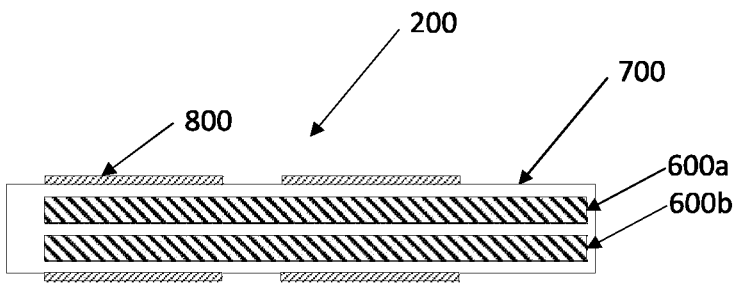
FIG. 4 shows an alternative embodiment of the conductor structure.

FIG. 4 shows an alternative embodiment of the conductor structure 200.

The conductor structure 200 is a multi-layer, high-current circuit board or PCB 200. In this conductor structure 200, a plurality of thick conductor layers 600*a*, 600*b*, two of which are shown by way of example in FIG. 4, are embedded insulated from one another between an insulating printed circuit board material 700. These conductor layers 600*a*, 600*b* can include copper. Preferably, thin conductor layers 800 can be arranged on outer surfaces of the printed circuit board material 700 in addition to the conductor layers 600*a*, 600*b* arranged or embedded on the inside thereof. These thin conductor layers 800 can include copper.

Figure 5:
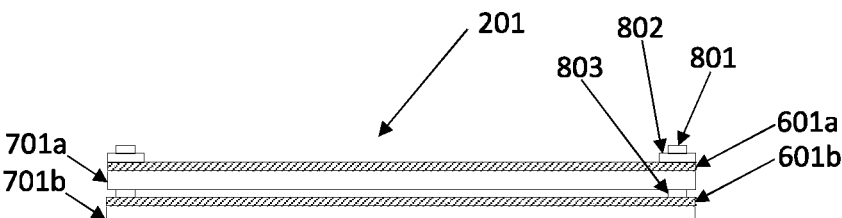
FIG. 5 shows a further alternative embodiment of the conductor structure.

FIG. 5 shows a further alternative embodiment of the conductor structure 201.

The conductor structure 201 has two or more single-layer printed circuit boards. In this conductor structure 201, a distance is provided between single-layer printed circuit boards which respectively have a conductor layer 601*a* and an insulating printed circuit board material 701*a* and a conductor layer 601*b* and an insulating printed circuit board material 701*b*, to maintain an air gap. The distance is ensured by a spacer 803. The printed circuit boards 601*a*, 601*b* are fastened to one another, for example by means of a screw 801, which is electrically insulated from at least one of the conductor layers 601*a*, 601*b* by means of insulation 802.

Figure 6:
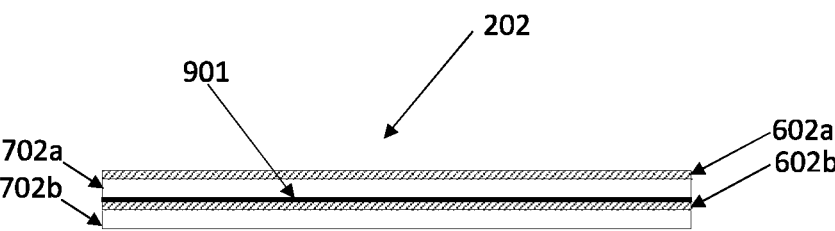
FIG. 6 shows a further alternative embodiment of the conductor structure.

FIG. 6 shows a further alternative embodiment of the conductor structure 202.

The conductor structure 202 has two or more single-layer printed circuit boards. To attach the circuit boards to one another, in this conductor structure 202 an adhesive layer 901 is arranged between single-layer circuit boards, which respectively have a conductor layer 602*a* and an insulating circuit board material 702*a* and a conductor layer 602*b* and an insulating circuit board material 702*b*.

Figure 7:
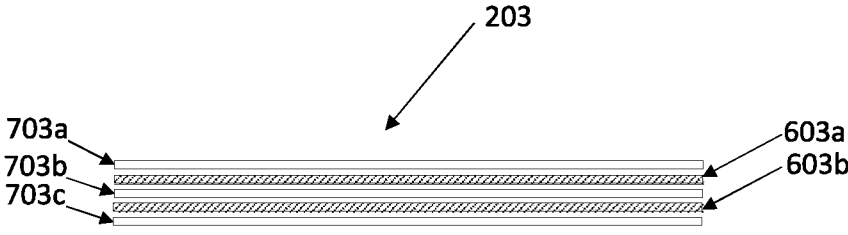
FIG. 7 shows a further alternative embodiment of the conductor structure.

FIG. 7 shows a further alternative embodiment of the conductor structure 203.

The conductor structure 203 has a plurality of conductor layers 603*a*, 603*b* and insulating layers 703*a*, 703*b*, 703*c* stacked one on top of the other. The stacking is such that one of the conductor layers 603*a*, 603*b* and one of the insulating layers 703*a*, 703*b*, 703*c* alternate in each case. The number of conductor layers 603*a*, 603*b* and insulating layers 703*a*, 703*b*, 703*c* is not limited to the number shown in FIG. 7. The conductor layers 603*a*, 603*b* and insulating layers 703*a*, 703*b*, 703*c* which are stacked one on top of the other are not laminated to each other and are not firmly bonded to each other.

Figure 8:
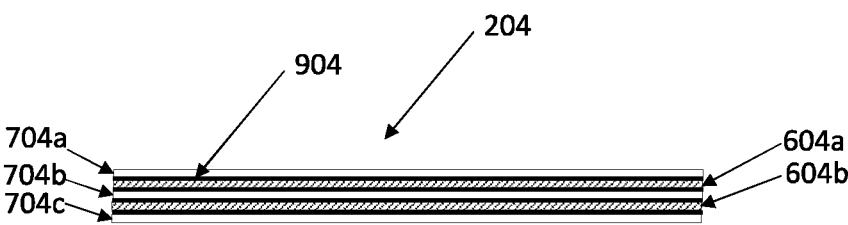
FIG. 8 shows a further alternative embodiment of the conductor structure.

FIG. 8 shows a further alternative embodiment of the conductor structure 204.

The conductor structure 204 has a plurality of conductor layers 604*a*, 604*b* and insulating layers 704*a*, 704*b*, 704*c* stacked one on top of the other. The stacking is such that one of the conductor layers 604*a*, 604*b* and one of the insulating layers 704*a*, 704*b*, 704*c* alternate in each case. The number of conductor layers 604*a*, 604*b* and insulating layers 704*a*, 704*b*, 704*c* is not limited to the number shown in FIG. 8. The stacked conductor layers 604*a*, 604*b* and insulating layers 704*a*, 704*b*, 704*c* are bonded together by respective adhesive layers 904 between respective mutually adjacent layers.

Figure 9A:
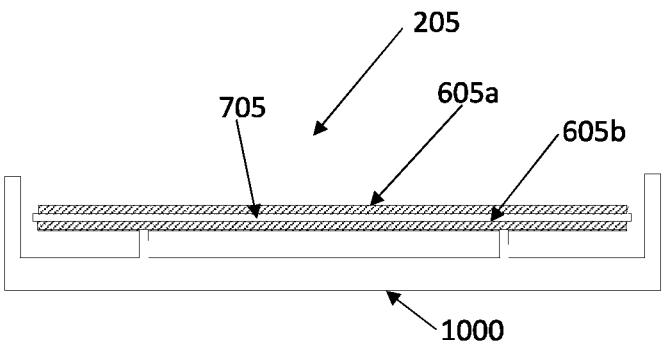
FIGS. 9a to 9c show a further alternative embodiment of the conductor structure.
Figure 9B:
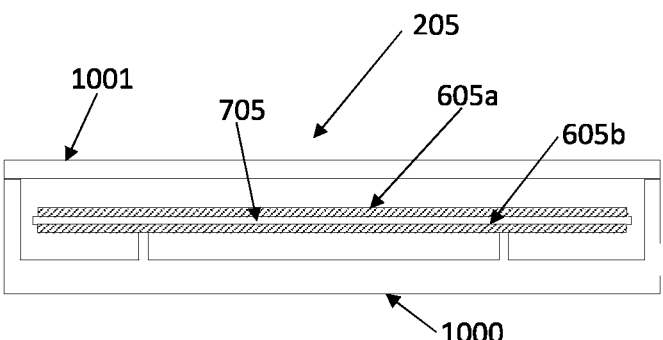
Figure 9C:
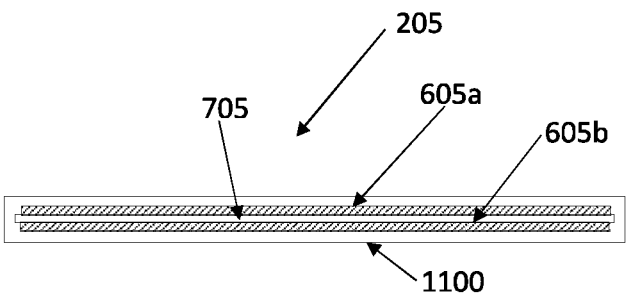

FIGS. 9*a* to 9*c* show a further alternative configuration of the conductor structure 205. More precisely, FIG. 9*a* and FIG. 9*b* show method steps for producing the conductor structure 205 shown in FIG. 9*c*.

As shown in FIG. 9*a*, multiple conductor layers 605*a*, 605*b* and at least one insulating layer 705 are stacked one on top of the other. The stacking is such that one of the conductor layers 605*a*, 605*b* and the at least one insulating layer 705 alternate in each case. The number of conductor layers 605*a*, 605*b* and insulating layer 705 is not limited to the number shown in FIGS. 9*a* to 9*c*. The conductor layers 605*a*, 605*b* and insulating layer 705 stacked one on top of the other are arranged in a molding form 1000.

As shown in FIG. 9*b*, the molding form is closed with a closure or cover. A molding material is introduced into the molding form 1000. After the molding material has hardened, the conductor structure 205 is removed from the molding form.

As shown in FIG. 9*c*, the result is the conductor structure 205 surrounded by the molding material 1100, such as an epoxy material.

LIST OF REFERENCE SIGNS

1 EMC filter device
2 Conductor structure
3*a* First capacitor
3*b* Second capacitor
4*a* First inductor
4*b* Second inductor
5 Busbar
6*a* First conducting layer
6*b* Second conducting layer
7 Insulating film/foil
8*a* First core
8*b* Second core
9 Power supply
10*a* First terminal
10*b* Second terminal
11 Inverter unit
12 Capacitor arrangement
13 Housing
14 Region fixed to the housing
15 Layer
16 Current input
17 Current output
18 Upper side
19 Underside
20 Power electronics module
21 First electronic component
22 Second electronic component
23 Third electronic component
24 Current sensor
25 Discharge resistor
26 Capacitor
27 Covering
28 EMC seal
29 Cover
30 Side panel
31 End face
32 Sealing strip
33 Dividing line
34 Adhesive connection
35 Bar
36 Weld point
200 Conductor structure
600*a* Conductor layer
600*b* Conductor layer
700 Circuit board material
800 Thin conductor layer
201 Conductor structure
601*a* Conductor layer
601*b* Conductor layer
701*a* Circuit board material
701*b* Circuit board material
801 Screw
802 Insulation
803 Spacer

8

202 Conductor structure
602*a* Conductor layer
602*b* Conductor layer
702*a* Circuit board material
702*b* Circuit board material
901 Adhesive layer
203 Conductor structure
603*a* Conductor layer
603*b* Conductor layer
703*a* Circuit board material
703*b* Circuit board material
703*c* Circuit board material
204 Conductor structure
604*a* Conductor layer
604*b* Conductor layer
704*a* Circuit board material
704*b* Circuit board material
704*c* Circuit board material
904 Adhesive layer
205 Conductor structure
605*a* Conductor layer
605*b* Conductor layer
705 Insulating layer
1000 Molding form
1001 Cover
1100 Molding material

The invention claimed is:

1. An EMC filter device for power electronics of an electric machine, comprising: an electrical conductor structure, a capacitor coupled to the electrical conductor structure and an inductor interacting with the electrical conductor structure, the electrical conductor structure having two separate conducting layers insulated from one another, wherein the inductor has a ring-shaped core, and the electrical conductor structure is inserted through the core, wherein the electrical conductor structure is configured to mount to a housing of an inverter unit on opposite axial sides of the core, and wherein the electrical conductor structure is configured to lie flat on a housing of an inverter unit such that the core can be least partially received in the housing of the inverter unit.

2. The EMC filter device according to claim 1, wherein an insulating layer is arranged between the conducting layers.

3. The EMC filter device according to claim 1, wherein the electrical conductor structure is surrounded outwardly in its entirety by an insulating layer.

4. The EMC filter device according to claim 1, wherein the capacitor is connected to a terminal configured to connect to a power supply.

5. A power electronics module for an electric machine, comprising: a capacitor arrangement; and an EMC filter device electrically connected to the capacitor arrangement, the EMC filter device including: an electrical conductor structure, a capacitor coupled to the electrical conductor structure and an inductor interacting with the electrical conductor structure, the electrical conductor structure having two separate conducting layers insulated from one another, wherein the inductor has a core, and the electrical conductor structure is inserted through the core, wherein the electrical conductor structure is mounted to a region fixed to a housing of an inverter unit on opposite axial sides of the core, and wherein the core is at least partially in the inverter housing.

6. The power electronics module according to claim 5, wherein a thermally conducting layer is provided between the electrical conductor structure and a region fixed to a housing of an inverter unit.

7. The power electronics module according to claim 5, wherein the electrical conductor structure lies flat directly on a region fixed to a housing of an inverter unit.

8. The power electronics module according to claim 5, wherein a current input of the power electronics module is formed directly by the electrical conductor structure, and a current output of the power electronics module is formed by the capacitor arrangement.

9. The power electronics module according to claim 5, wherein the conducting layers are insulated from each other between an insulating printed circuit board.

10. The power electronics module according to claim 5, wherein the electrical conductor structure includes: a first single-layer printed circuit board having one of the conducting layers and an insulating printed circuit board; a second single-layer printed circuit board having the other of the conducting layers and a further insulating printed circuit board; and a spacer arranged between the first single-layer printed circuit board and the second single layer-printed circuit board.

11. The power electronics module according to claim 5, wherein the electrical conductor structure includes: a first single-layer printed circuit board having one of the conducting layers and an insulating printed circuit board; a second single-layer printed circuit board having the other of the conducting layers and a further insulating printed circuit board; and an adhesive layer between the first single-layer printed circuit board and the second single layer-printed circuit board.

12. The power electronics module according to claim 5, wherein the electrical conductor structure includes two separate insulating layers, the two conducting layers and the two insulating layers being arranged alternatingly with each other.

13. The power electronics module according to claim 5, wherein an insulating layer is arranged between the conducting layers.

14. The power electronics module according to claim 5, wherein the electrical conductor structure is surrounded outwardly in its entirety by an insulating layer.

15. The power electronics module according to claim 5, wherein the capacitor is connected to a terminal configured to connect to a power supply.

* * * * *